(12) United States Patent
Wu et al.

(10) Patent No.: US 12,140,826 B2
(45) Date of Patent: Nov. 12, 2024

(54) TUNABLE DIFFRACTION GRATINGS USING SURFACE ACOUSTIC WAVES

(71) Applicant: California Institute of Technology, Pasadena, CA (US)

(72) Inventors: Yen-Hung Wu, Pasadena, CA (US); Stewart Sherrit, Montrose, CA (US); Valerie Scott Kristof, Pasadena, CA (US); Mina Rais-Zadeh, Pasadena, CA (US); Mustafa B. Coskun, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 665 days.

(21) Appl. No.: 17/397,767

(22) Filed: Aug. 9, 2021

(65) Prior Publication Data

US 2022/0043288 A1 Feb. 10, 2022

Related U.S. Application Data

(60) Provisional application No. 63/063,698, filed on Aug. 10, 2020.

(51) Int. Cl.
*G02F 1/11* (2006.01)
*H03H 9/02* (2006.01)
(Continued)

(52) U.S. Cl.
CPC ......... *G02F 1/113* (2013.01); *H03H 9/02881* (2013.01); *H03H 9/14541* (2013.01);
(Continued)

(58) Field of Classification Search
CPC .. G02F 1/113; G02F 2201/124; G01J 3/0237; G01J 3/18; H03H 9/02881;
(Continued)

(56) References Cited

U.S. PATENT DOCUMENTS

| 2008/0049328 A1* | 2/2008 | Zhou | G02F 1/292 |
| | | | 359/566 |
| 2008/0138013 A1* | 6/2008 | Parriaux | G02B 5/289 |
| | | | 385/37 |
| 2018/0069166 A1* | 3/2018 | Samarao | H03H 9/02559 |

OTHER PUBLICATIONS

Azad et al., "Synthesis and characterization of VO2 thin films on piezoelectric substrates", Thin Solid Films, vol. 742, No. 139055, 2021, 12 pgs., doi: 10.1016/j.tsf.2021.139055.
(Continued)

*Primary Examiner* — Emily P Pham
(74) *Attorney, Agent, or Firm* — KPPB LLP

(57) ABSTRACT

Disclosed herein is a tunable diffraction grating using surface acoustic waves. In some embodiments, the tunable diffraction grating includes a piezoelectric substrate including an interdigital transducer (IDT) region and a delay line region; a plurality of IDT electrodes positioned in the IDT region, wherein the IDT electrodes are each individually addressable such that the voltage applied to each of the electrodes is phase shifted, and wherein the IDT electrodes provide the phase shifted voltage to induce surface acoustic waves in the piezoelectric substrate in a pattern which produce a grating in the delay line region. Advantageously, tunable diffraction gratings have many applications including spectrometers for orbiters and rovers to Mars.

23 Claims, 15 Drawing Sheets
(13 of 15 Drawing Sheet(s) Filed in Color)

(51) Int. Cl.
*H03H 9/145* (2006.01)
*H03H 9/25* (2006.01)

(52) U.S. Cl.
CPC ......... *H03H 9/25* (2013.01); *G02F 2201/124* (2013.01); *H03H 9/02559* (2013.01); *H03H 9/14502* (2013.01)

(58) Field of Classification Search
CPC .. H03H 9/14541; H03H 9/25; H03H 9/02559; H03H 9/14502; H03H 9/14508; H03H 9/423
See application file for complete search history.

(56) References Cited

OTHER PUBLICATIONS

Che et al., "Thermal alteration: A possible reason for the inconsistency between OMEGA/CRISM and TES detections of phyllosilicates on Mars?", Geophysical Research Letters, vol. 41, No. 2, 2013, published online Jan. 9, 2014, 2013, pp. 321-327, https://doi.org/10.1002/2013GL058649.
Edwards et al., "Carbon sequestration on Mars", Geology, vol. 43, No. 10, 2015, pp. 863-866, https://doi.org/10.1130/G36983.1.
Frez et al., "Frequency Tunable Surface Acoustic Wave Actuators for Adjustable Pitch Diffraction Grating", Journal of Microelectromechanical Systems, vol. 29, No. 5, pp. 699-705, Oct. 2020, doi: 10.1109/JMEMS.2020.3000151.
Goudge et al., "Integrating CRISM and TES hyperspectral data to characterize a halloysite-bearing deposit in Kashira crater, Mars", Icarus, vol. 250, Apr. 2015, pp. 165-187, https://doi.org/10.1016/j.icarus.2014.11.034.
Hay, "Digitally tunable surface acoustic wave resonator", Thesis, Boise State University, Aug. 2009, 130 pgs.
Li, "Voltage-controlled tunable surface acoustic wave devices using multifunctional MgZnO/ZnO structures", Thesis, Rutgers University, 2017, 135 pgs.
Mei et al., "Undulate microarray fabrication on polymer film using standing surface acoustic waves and ultraviolet polymerization", Applied Physics Letters, vol. 108, 241911, 2016, published online Jun. 5, 2016, 5 pgs., https://doi.org/10.1063/1.4954233.
Mouroulis et al., "Optical design of a compact imaging spectrometer for planetary mineralogy", Optical Engineering, vol. 46, No. 6 (063001), Jun. 1, 2007, 9 pgs., https://doi.org/10.1117/1.2749499.
Muttikulangara et al., "MEMS Tunable Diffraction Grating for Spaceborne Imaging Spectroscopic Applications", Sensors, vol. 17, No. 10, Oct. 17, 2017, 2372; 13 pgs., https://doi.org/10.3390/s17102372.
Palmer, "Diffraction Grating Handbook", 5th edition, 204 pgs.
Rogers et al., "Compositional provinces of Mars from statistical analyses of TES, GRS, OMEGA and CRISM data", Journal of Geographical Research: Planets, vol. 120, No. 1, 2014, pp. 62-91, doi: 10.1002/2014JE004690.
Truxal et al., "Design of a MEMS tunable polymer grating for single detector spectroscopy", International Journal of Optomechatronics, vol. 2, 2008, pp. 75-87, DOI: 10.1080/15599610802081779.
Viviano et al., "Using Themis data to resolve the discrepancy between CRISM/OMEAG and TES modeled phyllosilicate abundance in Mawrth Vallis", Icarus, vol. 226, Issue 1, Sep. 2013, pp. 497-509, DOI: 10.1016/j.icarus.2013.06.005.
Wang et al., "Patterned microstructure array fabrication by using a novel standing surface acoustic wave device", Journal of Micro- and Nano-Manufacturing, vol. 6, No. 2, Jun. 2018, Paper No. JMNM-17-1057, published online Dec. 26, 2017, 021002, 7 pgs., https://doi.org/10.1115/1.4038675.
Wong et al., "Analog tunable gratings driven by thin-film piezoelectric microelectromechanical actuators", Applied Optics, vol. 42, No. 4, Feb. 1, 2003, pp. 621-626.
Zhu et al., "A multi-IDT tunable surface acoustic wave filter", IEEE Transactions on Ultrasonics, Ferroelectrics, and Frequency Control, vol. 48, No. 5, Sep. 2001, pp. 1383-1388. doi: 10.1109/58.949747.

\* cited by examiner

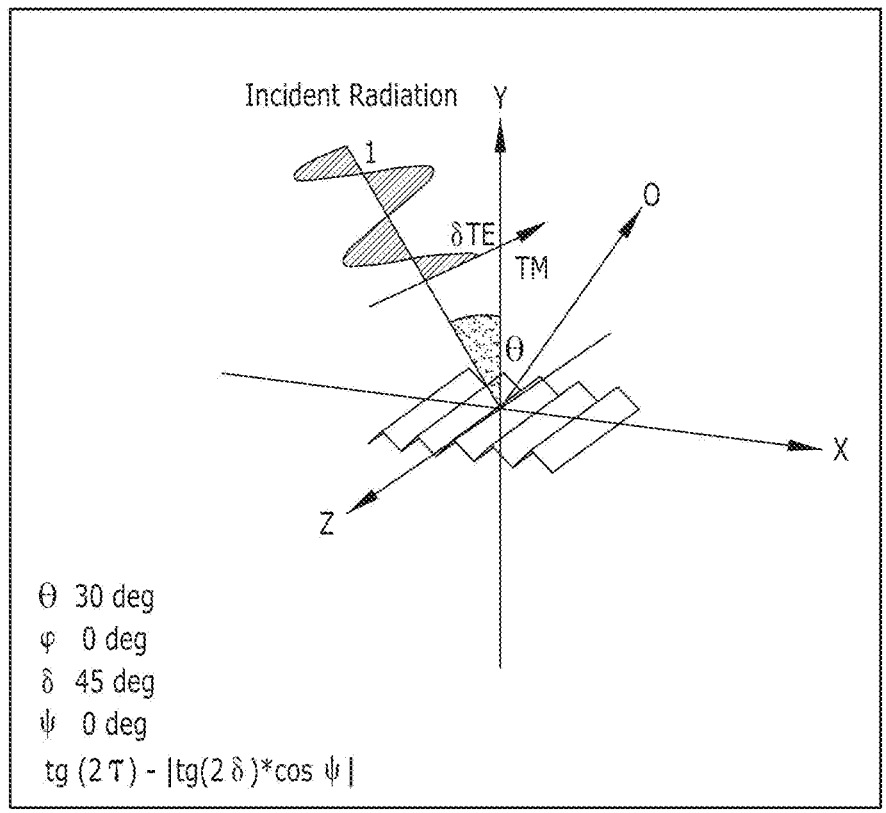
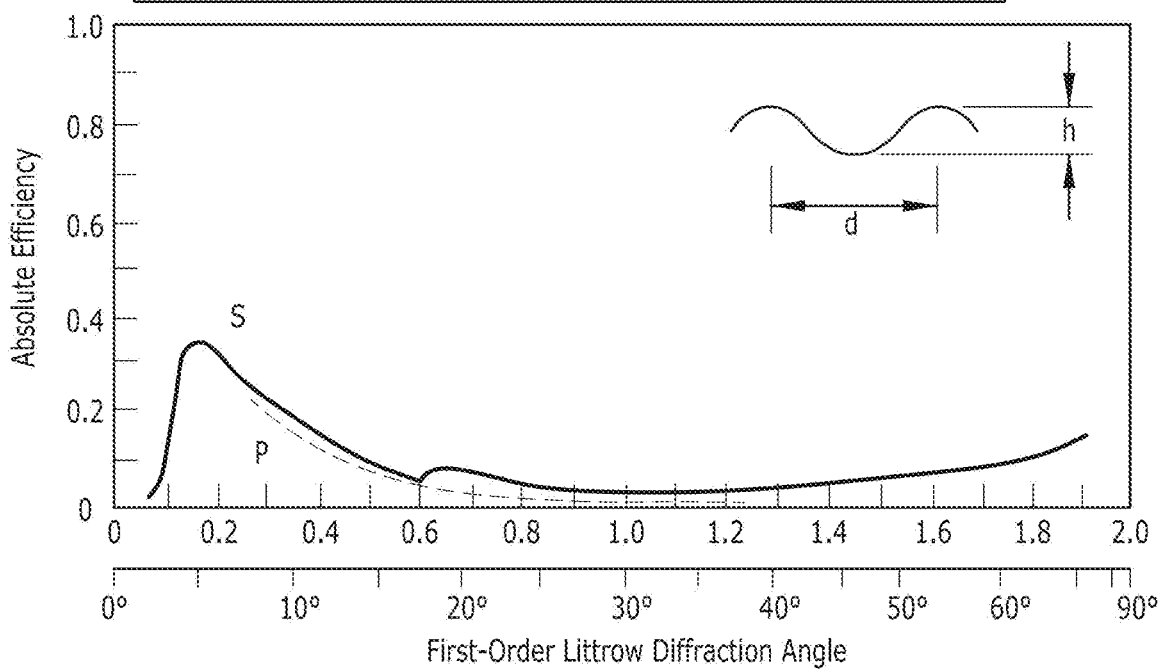
FIG. 2

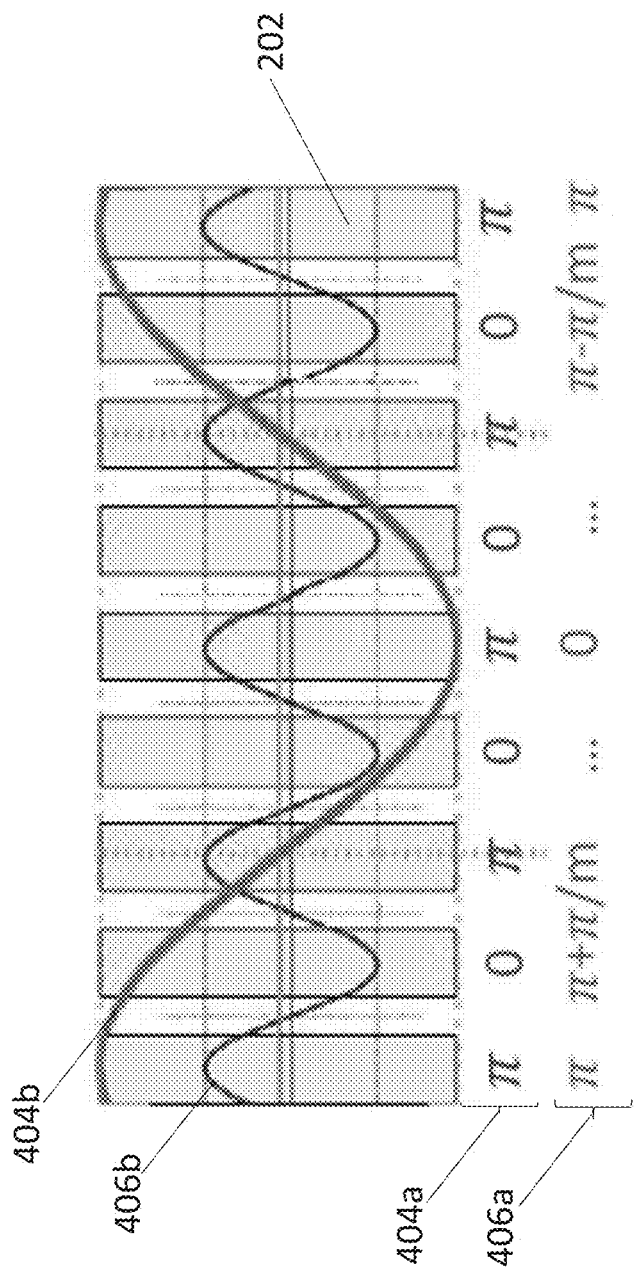

TUNABLE DIFFRACTION GRATINGS USING SURFACE ACOUSTIC WAVES

CROSS-REFERENCE TO RELATED APPLICATIONS

This application claims the benefit of and priority under 35 U.S.C. § 119(e) to U.S. Provisional Patent Application Ser. No. 63/063,698 entitled "Tunable Pitch Diffraction Gratings Using Surface Acoustic Waves," filed Aug. 10, 2020, which is incorporated herein by reference in its entirety for all purposes.

STATEMENT OF FEDERAL SUPPORT

This invention was made with government support under Grant No. 80NMO0018D0004 awarded by NASA (JPL). The government has certain rights in the invention.

FIELD OF THE INVENTION

The present invention generally relates to a tunable pitch diffraction grating using surface acoustic waves.

BACKGROUND

Gratings based imaging spectrometers are remote sensing instruments in the planetary, earth, and astrophysics sciences. In such instruments, the grating pitch may directly and indirectly affect an instrument's spectral resolving power, spectral coverage vs spectral overlap, detector format, image quality, system throughput, payload packaging size, etc. These design decisions manifest themselves in system size, mass and power, and cost. In instruments used in current/planned missions, the diffraction grating may be machined such that once it is patterned, the pitch or spacing is set and cannot be changed. For this same reason, to cover a wider spectral range, a number of diffraction gratings may be needed. In addition to size, the cost of these instrument may be high due to the fact that multiple devices (e.g. diffraction gratings) may be needed for imaging.

Reflectance and emission spectroscopy are well-established and powerful remote sensing techniques that may be used for determining the composition and thermophysical properties of planetary surfaces and their atmospheres. Visible, near infrared, and thermal spectrometers of various kinds have been flown on space missions to every major body in the solar system. They are also used to observe landscapes on Earth. The advances in spectrometer design that may be enabled by the development of the presented tunable gratings may lead to a new class of spectrometers.

Spectrometers have been included on orbiters and rovers to Mars for the past several decades. Historically, these instruments may be tailored either to the visible and shortwave infrared (VSWIR, 0.4-5 µm) or thermal infrared (TIR, 5-50 µm) portion of the spectrum, but not both. The VSWIR portion of the spectrum (e.g. 0.4-2 µm) is sensitive to electronic transitions caused by variations in transition metal elements. On Mars, transition element absorptions is commonly associated with the highly abundant Fe-bearing phases including iron oxides, iron-bearing sulfates, olivine, and pyroxene. VSWIR (1-5 µm) is also sensitive to vibrational overtones of OH, $H_2O$, and $CO_3$-bearing phases, including clays, carbonates, and hydrated minerals. The thermal infrared portion of the spectrum is capable of detecting variations in silica polymerization, and spectral datasets covering this wavelength range can be used to detect silica and silicate minerals through the presence and shape of the fundamental Si—O stretch at 10 µm. Therefore, on Mars, a diffraction grating covering the 0.36 µm to 10 µm range may be ideal. The development of a tunable diffraction grating could enable future spectrometer designs that cover wavelengths from the visible through the shortest wavelength end of the infrared portion of the spectrum. For Mars, this advancement would allow co-located detections of iron-bearing, water-bearing, and silica-rich phases. The ability to determine a wider range of materials than permitted by VSWIR or TIR alone would be a powerful geological tool.

SUMMARY OF THE INVENTION

Various embodiments are directed to a tunable diffraction grating including: a piezoelectric substrate comprising an interdigital transducer (IDT) region and a delay line region; a plurality of IDT electrodes positioned in the IDT region, wherein the IDT electrodes are each individually addressable such that the signal applied to each of the electrodes is phase shifted, and wherein the IDT electrodes provide the phase shifted signal to induce surface acoustic waves in the piezoelectric substrate in a pattern which produces a grating in the delay line region.

In various other embodiments, the piezoelectric substrate includes lithium niobate, aluminum nitride, or scandium aluminum nitride.

In still various other embodiments, the pitch of the grating in the delay line region is tunable based on the phase shift to the signal applied to each of the IDT electrodes.

In still various other embodiments, the IDT electrodes are configured to provide a phase shift to a first IDT electrode of $\pi$ and then adding additional phase shift of $\pi/m$ sequentially to each adjacent electrode until the mth electrode which is applied no phase shift, after the mth electrode, the following electrodes add a $\pi/m$ phase delay sequentially to each adjacent electrode until a phase shift of $\pi$, and m is a positive integer value.

In still various other embodiments, an optimum diffraction efficiency is achieved by changing the phase of the signal applied to each IDT electrode to adjust the SAW wavelength of the grating with respect to the optical wavelength of the inbound light on the grating.

In still various other embodiments, a common alternating RF source is applied to a plurality of phase shifters each applied to one of the IDT electrodes.

In still various other embodiments, the delay line region is coated with a material to enhance diffraction efficiency of the grating.

In still various other embodiments, the material includes a polymer.

In still various other embodiments, the polymer includes PMMA or polyimide.

In still various other embodiments, the material includes a phase change material.

In still various other embodiments, the phase change material includes vanadium oxide or germanium telluride.

In still various other embodiments, the phase change material coating is strain patterned by applying the alternating RF signal to the IDT electrodes.

In still various other embodiments, the phase shifted signal applied to each of IDT electrodes is provided by a phased array.

In still various other embodiments, the phase shifted voltages utilize harmonics to induce surface acoustic waves with wavelengths which are smaller than what would be induced without harmonics.

Further, various embodiments are directed to a method of operating a tunable diffraction grating including: providing a piezoelectric substrate including an actuator region and a delay line region; and applying a signal to the actuator region such that multiple different regions within the actuator region with different phase shifts are formed, wherein the signal with different phases in the actuator region induces a tunable wavelength surface acoustic wave travelling on the delay line region, and wherein the delay line region is used as a tunable pitch diffraction grating.

In various other embodiments, the signal applied is adjusted to provide a height of the grating.

In still various other embodiments, the signal applied is an RF voltage.

In still various other embodiments, applying the signal to the actuator region such that multiple different regions within the actuator region with different phases are formed includes applying a signal with a π phase delay to every other region and applying a signal with no phase delay to the rest of the regions, where the wavelength of inbound optical light is modulated by the grating.

In still various other embodiments, applying the signal to the actuator region such that multiple different regions within the actuator region with different phases are formed comprises: applying a signal with a π phase delay to a first region and then adding π/m sequentially to each adjacent region until the mth region which is applied no phase shift, after the mth region, applying a signal adding an π/m phase delay sequentially to each adjacent region until a phase shift of π, wherein m is a positive integer value, and wherein the wavelength of optical light is modulated by the grating.

In still various other embodiments, applying a signal to the actuator region such that multiple different regions within the actuator region with different phase shifts are formed is performed using an alternating RF source and phase shifters.

In still various other embodiments, the grating in the delay line region is tunable based on the voltages with different phases applied to multiple different regions.

In still various other embodiments, the piezoelectric substrate includes lithium niobate, aluminum nitride, or scandium aluminum nitride.

In still various other embodiments, the pitch of the grating in the delay line region is tunable based on the phase shift to the signal applied to each region.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The description and claims will be more fully understood with reference to the following figures and data graphs, which are presented as exemplary embodiments of the invention and should not be construed as a complete recitation of the scope of the invention.

FIG. 2 illustrates a 1st order efficiency curve including SAW peak to peak amplitude $(h)/\lambda_{SAW}(d)=0.05$ and Littrow mounting for s-polarized and p-polarized light.

FIG. 3 illustrates a schematic of the tuning principle of the tunable SAW grating of FIG. 1B in accordance with an embodiment of the invention.

DETAILED DESCRIPTION

Figure 1A:
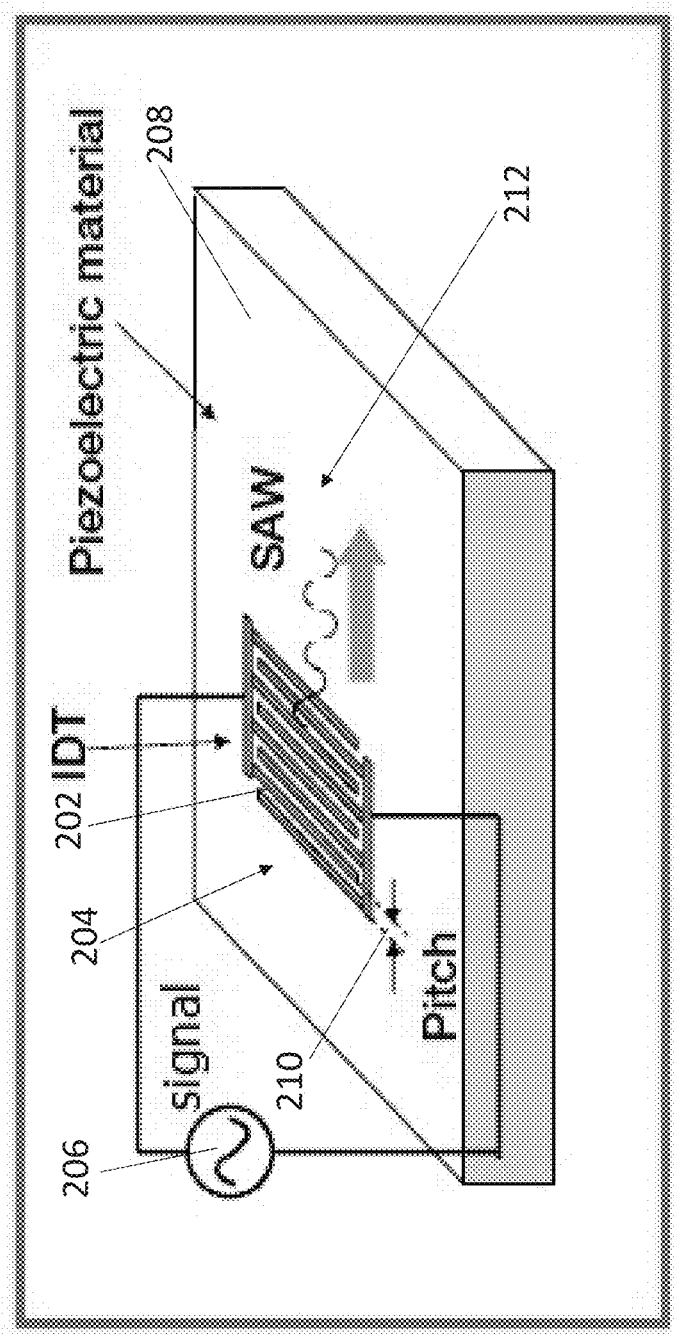
FIG. 1A illustrates an example SAW transducer which induces a surface acoustic wave traveling on a piezoelectric substrate.

Various embodiments of the invention relate to a surface acoustic wave (SAW) transducer that may be used to implement a tunable diffraction grating. Tunable diffraction gratings can enable spectrometers with high resolving power, over several octaves of wavelengths, without trading off spatial resolution, in one self-contained module, and without a wheel mechanism. This tunable pitch diffraction grating may be utilized in a new class of spectrometers that are sensitive over a large wavelength range. Such instruments would enable improved science at planetary bodies across the solar system by permitting identification of a larger number of surface materials at higher spatial resolutions than the currently available technology achieves.

A SAW is an acoustic wave traveling along the surface of a material, with a sinusoid topological profile. This same surface profile can be used as a diffraction grating. Electronic SAW devices use interdigital transducers (IDT) on a piezoelectric substrate to convert acoustic waves to electrical signals, and vice versa, by exploiting the piezoelectric effects. For example, RF SAW filters working in several MHz to a few GHz range may be used in today's consumer electronics and because these SAW devices are small (e.g. in the order of a few 100 µm on a side) and have very sharp frequency responses. A number of SAW devices can be integrated into a system without heavily loading the system size or volume (e.g. in a cellular phone). The frequency of resonance and hence the period of the diffraction grating can be fixed by the IDT finger pitch as well as the velocity of SAW in the piezoelectric material.

Various embodiments of the invention relate to a widely tunable diffraction grating. To achieving tunability for SAW transducers, a DC bias may be applied to the piezoelectric substrate to change the acoustic wave velocity and hence the wavelength. Tuning using this approach is limited to a few percent at best and can be used as trimming method and not to implement a hyperspectral imager. Other approaches based on bulk acoustic wave or using liquid crystals may be used as well. Bulk acoustic wave optical devices, such acousto-optic modulators (AOMs), are common photonic devices. The RF energy required to generate the bulk acoustic wave is proportional to the $\lambda_{optical}^2$, so AOM's generally have small (~1 mm) aperture. They also have low diffractive power, or $\lambda_{optical}/\lambda_{AOM}$ period«0.1. As of today, there is no AOM material that covers the 0.3 µm<$\lambda_{optical}$<10 µm wavelength range. Using a liquid crystal display as a variable diffraction grating device may not solve this issue as the liquid crystal pixel size is generally several 10's of micrometers, or $\lambda_{optical}/\lambda_{liquid\ crystal\ period}$«0.1 in the visible wavelength range. There is no known liquid crystal material that covers the wide wavelength range of coverage.

Various embodiments of the invention relate to a widely tunable (e.g. several octaves) diffraction grating based on surface acoustic waves as opposed to current approaches that rely on fixed etched features as diffraction gratings. Diffraction gratings are commonly used in space applications and they are currently almost exclusively based on fixed patterns. Using tunable SAW makes it possible to broaden the imaging range without trading power, size, or complexity of the system.

The velocity of SAW is a function of the material properties and is constant. The velocity of SAW is related to SAW wavelength and frequency through $V_{saw}=f_{RF} \times \lambda_{saw}$. In some embodiments, the SAW wavelength is defined using interdigital transducer (IDT) electrodes with a pitch equal to $\lambda/2$. In such embodiments, the SAW voltages in the adjacent IDT electrodes is $\pi$ phase shifted. The delay line is between two sets of IDTs and supports the SAW with surface topography that is naturally sinusoidal. This delay line can be used as the diffraction grating (without actually patterning anything on the delay line itself). As the SAW is sinusoidal, it may only support m=−1, 0, +1 diffractive orders. By working near the Littrow angle, mechanical baffle and beam dump may be placed to eliminate the spectral overlap. In the disclosed embodiments, to tune the frequency and thus the pitch of the diffraction grating that is created on the delay line, the pitch of the IDT is tuned using a phased array. The SAW period is tuned by introducing a matching phase delay to the IDT, similar to the constructive interference of a phase array radar by varying the phase delay in each node. In the disclosed embodiments, the SAW tunable grating may be driven with a variable RF frequency source, f. The variable RF source can be a voltage-controlled oscillator (VCO) with moderate phase noise. Due to the high Q of the SAW delay line, an ultra-stable and clean RF input may not be required.

For each $\lambda_{optical}/\lambda_{saw}$ period condition, there is a corresponding peak diffraction efficiency. The peak diffraction efficiency depends on the sinusoid grating groove height (or the displacement amplitude), h, which depends on the coupling efficiency of the piezoelectric material, the input voltage amplitude of the RF source, and the number of IDT electrodes. To achieve the desired $h/\lambda_{saw\ period}$ without the need for application of large amplitude RF signals, the substrate material should have a large piezoelectric coupling efficiency (to reduce the force required to create the SAW diffraction grating amplitude). In some embodiments, the substrate material may be lithium niobate ($LiNbO_2$), aluminum nitride, or scandium aluminum nitride. Assuming $LiNbO_2$ as the substrate with $V_{saw}$~3500 m/s, for $\lambda_{UV}=\lambda_{saw}=0.3$ µm, $f_{RF,\ 0.3\ µm}$~11 GHz. The $\lambda_{saw}$ may be adjusted continuously. For example, to tune the SAW diffraction grating for $\lambda_{LWIR}=\lambda_{saw}=10$ µm, the phase may be modified in the adjacent IDT electrodes to $\lambda/32$ (10/0.31=32), and $f_{RF,10\ µm}$=350 MHz.

In the disclosed embodiments, the tunable SAW transducer may be used to implement tunable diffraction gratings with a broad wavelength range of 1.3 µm to 9 µm. The diffraction efficiency is about 30% assuming a small surface amplitude but can be further improved by coating the surface of the delay line with a polymer to achieve surface amplitude that is close to ⅒ of the optical wavelength. Alternatively, the surface of the delay line can be coated with a phase change material to improve the diffraction efficiency. Such widely tunable diffraction gratings can enable instruments with improved science at planetary bodies across the solar system by permitting identification of a large number of surface materials at high spatial resolutions.

Embodiments Including a Tunable SAW Transducer

The development of a tunable diffraction grating could enable future spectrometer designs that cover wavelengths from the visible through the shortest wavelength end of the infrared portion of the spectrum.

A number of tunable diffraction gratings have been proposed but with limited tuning range or diffraction efficiency. Some examples include a flexible polymer microbridge with a nanoimprinted grating pattern on the top surface. Microelectromechanical system (MEMS) silicon actuators mechanically strain the microbridge to variably tune the grating period. This device has a limited spectral range of 65 nm due to the microbridge strain induced by the MEMS actuators. Some examples tune the pitch of a grating using a piezoelectric actuator. The grating period may change up to 8.3 nm (e.g. 0.21% strain in the membrane) at 10 V and a diffracted angular change of 486 µrad. In a different approach, a suspended serpentine connected to comb drive actuators on both ends was used to create a tunable diffraction grating. While the displacement range may be improved with this approach, this device may have low shock tolerance and may be extremely sensitive to any stress source that would result in un-even grating fingers.

In some embodiments, SAW-based diffraction gratings are used to create a tunable diffraction grating. In some embodiments, tunability is achieved by apply a DC bias to the piezoelectric substrate to change the acoustic wave velocity. Tuning using this approach may be limited to a few percent and may not be used to implement a broadband high spectral resolution imager. Various embodiments of the invention use the SAW delay line itself as the grating and tune the frequency of the SAW to tune the pitch of the diffraction grating.

Electronic SAW devices use interdigital transducers (IDTs) on a piezoelectric substrate to convert acoustic waves to electrical signals, and vice versa, by exploiting the piezoelectric effects. FIG. 1A illustrates an example SAW device which induces a travelling wave on a piezoelectric substrate 208. The piezoelectric substrate 208 may be a piezoelectric material such as lithium niobate. The piezoelectric substrate 208 may include an IDT region 204 and a delay line region 212. The IDT region may include IDT electrodes 202 which have a certain pitch 210. The IDT electrodes 202 are each connected to a common alternating RF source 206. The IDT electrodes 202 provide a certain voltage to induce surface acoustic waves in the piezoelectric substrate 208 in a certain pattern which produce a travelling wave in the delay line region 212.

The delay line region 212 may be located between two sets of IDTs which support the SAW with surface topography that is naturally sinusoidal. The velocity of SAW is a function of the material properties and is a constant. The SAW velocity is related to SAW wavelength and frequency through the following equation: $v_{saw}=f_{RF} \times \lambda_{saw}$.

Figure 1B:
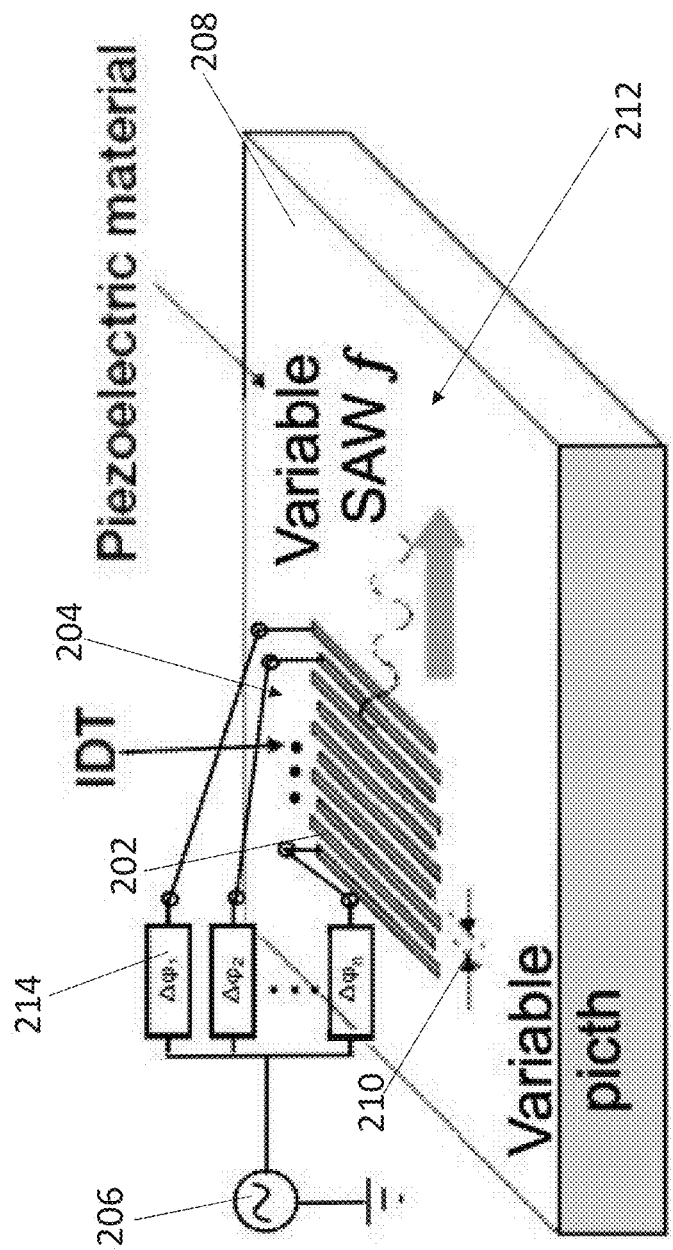
FIG. 1B illustrates a schematic for a tunable SAW transducer in accordance with an embodiment of the invention.

FIG. 1B illustrates a schematic for a tunable SAW grating in accordance with an embodiment of the invention. The tunable SAW grating includes a piezoelectric substrate 208. The piezoelectric substrate 208 may be a piezoelectric material such as lithium niobate. The piezoelectric substrate 208 may include an IDT region 204 and a delay line region 212. The IDT region may include IDT electrodes 202 which may include a variable pitch 210. The IDT electrodes 202 may be each connected to a common alternating RF source 206. The IDT electrodes 202 may each be further connected to a phase shifter 214. The phase shifters 214 may be configured to apply a different phase delay to each of the IDT electrodes 202. The IDT electrodes may provide a certain voltage to induce surface acoustic waves in the piezoelectric substrate 208 in a certain pattern which produce a tunable pitch travelling wave in the delay line region 212. The delay line region is used as a tunable pitch diffraction grating in the embodiment of the invention without actually patterning anything on the delay line region itself.

To tune the frequency and thus the pitch of the induced diffraction grating, the pitch of the IDT electrodes may be tuned using the phase shifters 214. More specifically, the $\lambda_{SAW}$ may be varied by introducing a matching phase delay to the IDT electrodes 202, similar to the constructive interference of a phase array radar. The SAW tunable grating may be driven with the common alternating source 206. The common alternating source 206 may be a variable RF frequency source, f. The variable RF source may be a voltage-controlled oscillator (VCO) with moderate phase noise. Due to the high-Q (e.g. >100) of the SAW delay line region 212, a stable and clean RF input may not be required. As the SAW is sinusoidal, it may only support m=−1, 0, +1 diffractive orders. By working near the Littrow angle, mechanical baffle and beam dump can be placed to eliminate the spectral overlap.

In some embodiments, the piezoelectric substrate 208 may be a lithium niobate ($LiNbO_3$) crystal which has proper piezoelectric properties. In some embodiments, achieving large surface amplitudes using a $LiNbO_3$ substrate 208 may not be feasible (the maximum strain for ceramics is usually <0.03%). In some embodiments, a coating layer may be applied to the delay line region to boost the surface displacement. In some embodiments, the coating layer may be a polymer such as PMMA or polyimide.

Figure 1C:
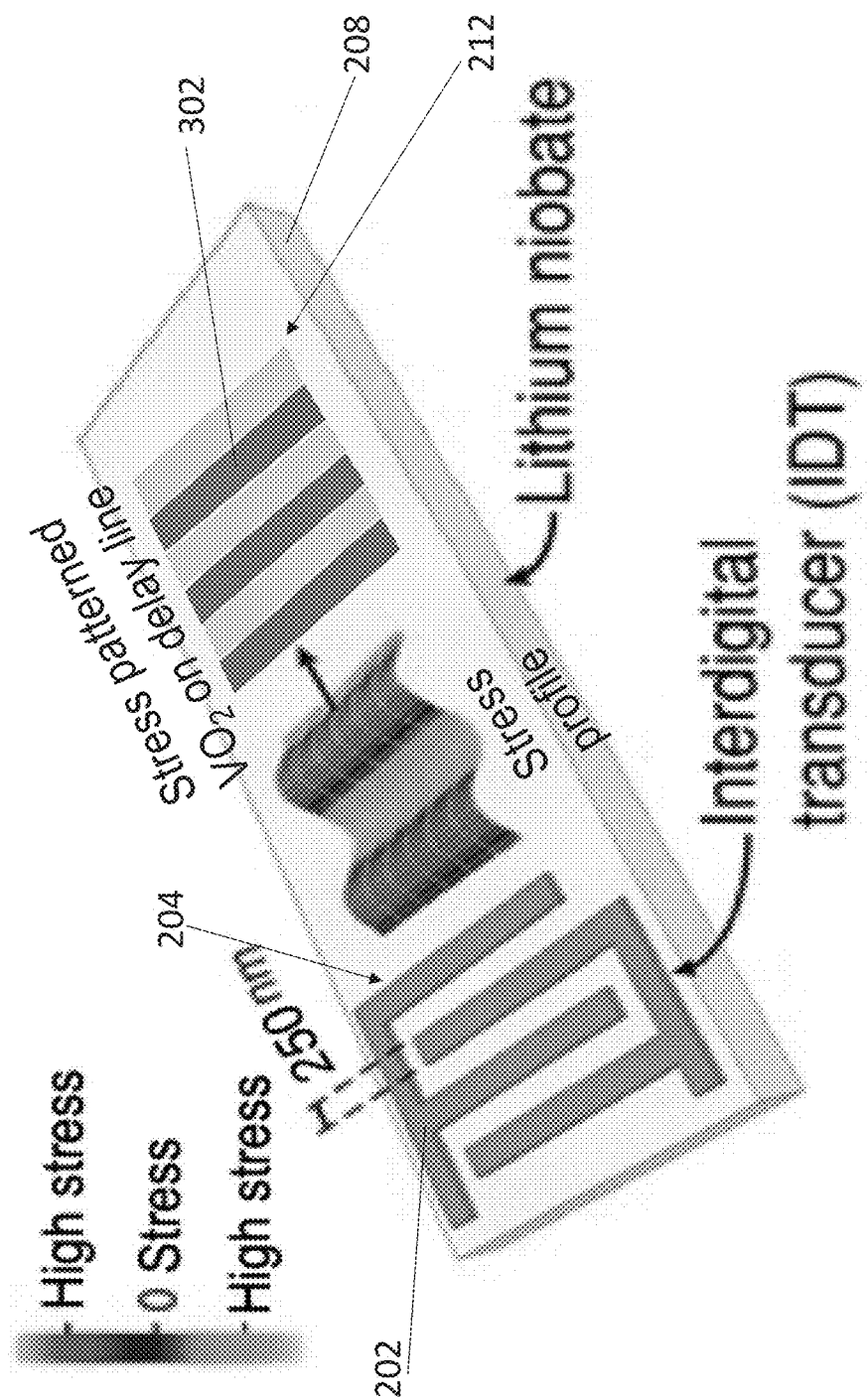
FIG. 1C illustrates a schematic for a tunable SAW grating in accordance with an embodiment of the invention.

FIG. 1C illustrates a schematic for a tunable SAW grating in accordance with an embodiment of the invention. The tunable SAW grating may be similar to the tunable SAW grating described in connection with FIGS. 1A and 1B and the overlapping features will not be repeated. The tunable SAW grating may include a coating layer 302 in the delay line region 212 of the piezoelectric substrate 208. The coating layer 302 may be applied to the delay line region to boost the surface displacement. In some embodiments, the coating layer may be a phase change material such as vanadium oxide or germanium telluride. The coating layer may be strain patterned to create a reconfigurable diffraction grating. The coating layer may be strain patterned when subjected to surface displacement.

FIG. 2 illustrates a $1^{st}$ order efficiency curve including SAW peak to peak amplitude (h)/$\lambda_{SAW}$(d)=0.05 and Littrow mounting for s-polarized and p-polarized light. Assuming an h/$\lambda_{SAW}$ value of only 0.05, the simulated diffraction efficiency is plotted. The range of the tunable grating period may cover 0.12<$\lambda_{optical}$/$\lambda_{SAW}$<0.21 to achieve minimum diffraction efficiency of 30%. In other words, the SAW wavelength or the groove pitch may be about 5×~8× the optical wavelength to achieve high diffractive power. In some embodiments, the substrate may include $LiNbO_3$ with $V_{SAW}$~3900 m/s, for $\lambda_{optical}$=0.12×$\lambda_{SAW}$=0.36 μm, $f_{RF,3\ \mu m}$=1300 MHz ($\lambda_{SAW}$=3 μm).

FIG. 3 illustrates a schematic of the tuning principle of the tunable SAW grating of FIG. 1B in accordance with an embodiment of the invention. To change the SAW wavelength, the phase applied to each IDT electrodes 202 may be changed. To change h, the RF voltage amplitude may be adjusted. A first phase 406a applied to the IDT electrodes 202 correspond to a configuration where $\lambda_{optical}$=m*$\lambda_{saw}$ at minimum $\lambda_{optical}$. $\lambda_{optical}$ is the wavelength of inbound light to the tunable SAW grating. $\lambda_{saw}$ is the wavelength of the tunable SAW grating in the delay line region 212. A first resultant grating 406b of the delay line correspond to the first phase 406a applied to each IDT electrodes 202. For example, $\lambda_{saw}$=514 nm and $\lambda_{optical}$=360 nm. A second phase 404a applied to each IDT electrode 202 corresponds to a configuration where $\lambda_{optical}$=$\lambda_{saw}$ at maximum $\lambda_{optical}$. A second resultant grating 404b of the delay line correspond to the first phase 404a applied to each IDT electrode 202. For example, $\lambda_{saw}$=10,000 nm and $\lambda_{optical}$=10,000 nm. $\lambda_{saw}$ may be adjusted by changing the effective pitch to address the largest wavelength. For example, to tune the SAW diffraction grating for $\lambda_{optical}$=0.21×$\lambda_{SAW}$=10 μm, the RF frequency applied to the IDT electrode 202 may be modified to ~$f_{RF,50\ \mu m}$=78 MHz. Each diffractive grating pitch may cover one octave of optical range. In some embodiments, smaller wavelengths may be achieved without patterning narrower IDT electrodes 202 by utilizing harmonics of the main modes.

Figure 4A:
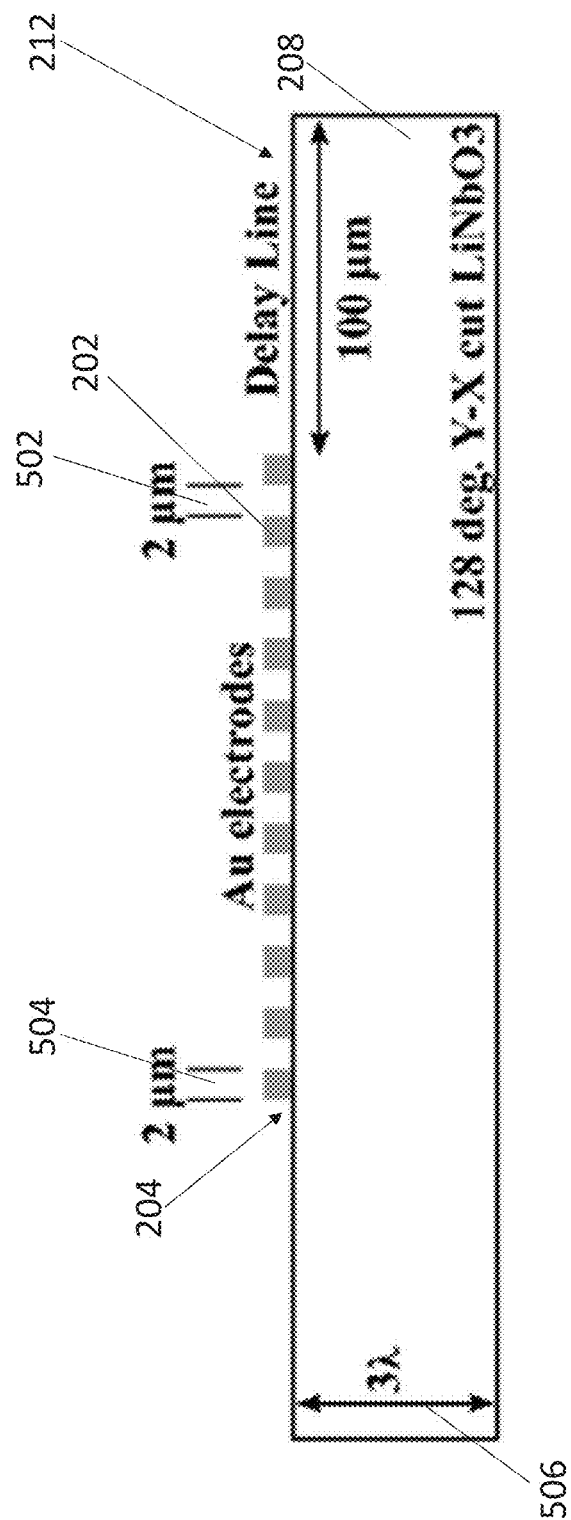
FIG. 4A illustrates a 2D schematic of the SAW device of FIG. 1B detailing the dimensions and materials used in accordance with an embodiment of the invention.

FIG. 4A illustrates a 2D schematic of the SAW device of FIG. 1B detailing the dimensions and materials used in accordance with an embodiment of the invention. The SAW device includes a piezoelectric substrate 208 which may be a 128° Y-X cut $LiNbO_3$ substrate. The IDT electrodes 202 may be 11 parallel gold (Au) electrodes deposited on the piezoelectric substrate 208. The IDT electrodes 202 may include a width 504 of 2 μm and/or a spacing of 2 μm. As the effective depth of penetration of the surface waves is less than a wavelength, the piezoelectric substrate 208 may include a substrate thickness 506 of three times the wavelength of the inbound light. In some embodiments, the piezoelectric substrate 208 may have a substrate width of 240 μm in order to be able to visualize larger waves launched from the IDT region 204. A low reflecting boundary condition may be assigned to the bottom and side edges to minimize the wave reflection and potential interference of the reflected wave with the incoming traveling wave from the delay line.

In one example of the disclosed embodiments, simulations were performed. The maximum mesh size in all simulations was set to one tenth of the wavelength in order to balance the accuracy and the computational efficiency. Prior to the time domain simulations, a frequency analysis from 450 MHz to 550 MHz was conducted. In some embodiments, the resonant frequency of the SAW device, f, was around 488.89 MHz. During the transient analysis, input signals with various phases may be applied to IDT electrodes 202 on the piezoelectric substrate 208 in a systematic manner, and it is shown that wavelength and correspondingly f can be tuned based on the input configuration.

Figure 4B:
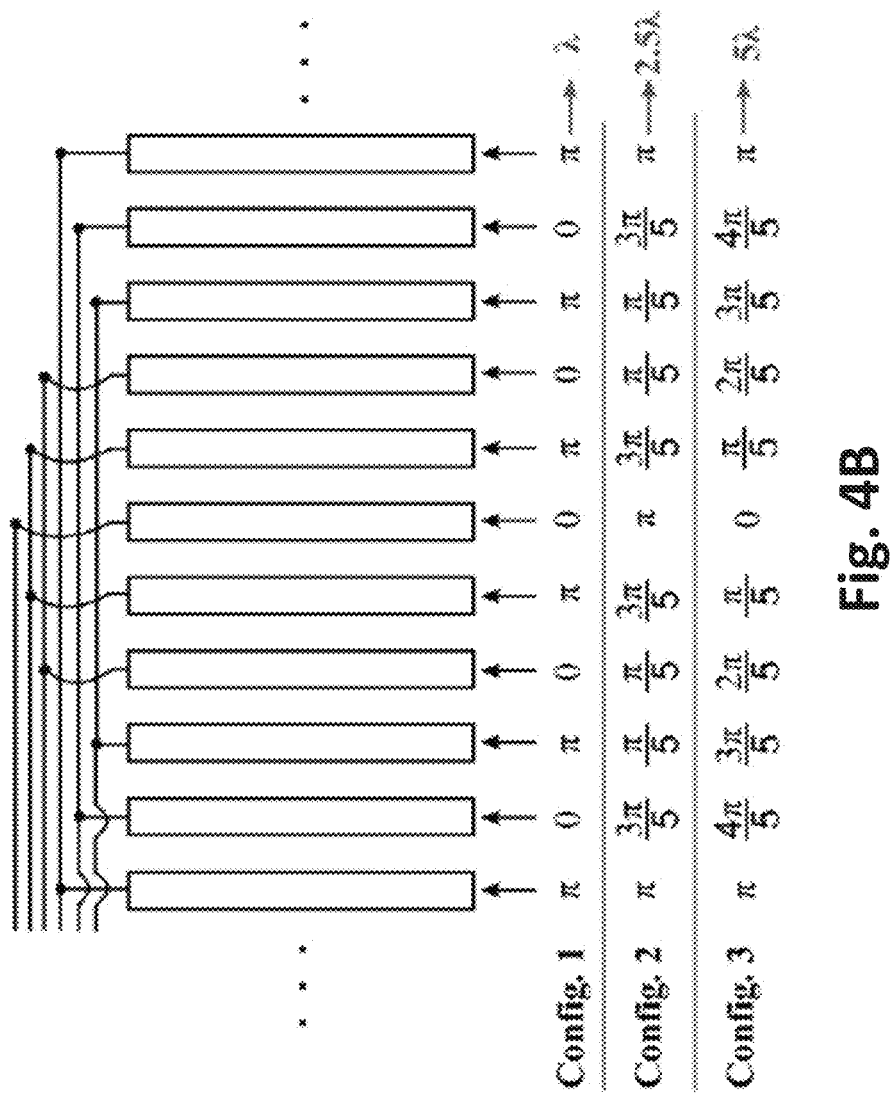
FIG. 4B illustrates a three-input configuration for different phase delay schemes applied to the IDT electrodes.

FIG. 4B illustrates a three-input configurations for different phase delay schemes applied to the IDT electrodes 202. In each configuration, input signals with the listed phases are applied to the designated electrodes which may modify the resonant frequency and wavelength of the SAW device. For each configuration, displacement profiles along the delay line were obtained. The first phase configuration in FIG. 4B is an input configuration for a reference SAW device. Here, the excitation frequency was set to the previously calculated resonant frequency, f, and the input to the electrodes was configured such that each electrode has a phase difference of 180 degrees with respect to the adjacent electrodes. As illustrated, changing the phase applied to the electrodes changes the acoustic wavelengths.

Figure 5:
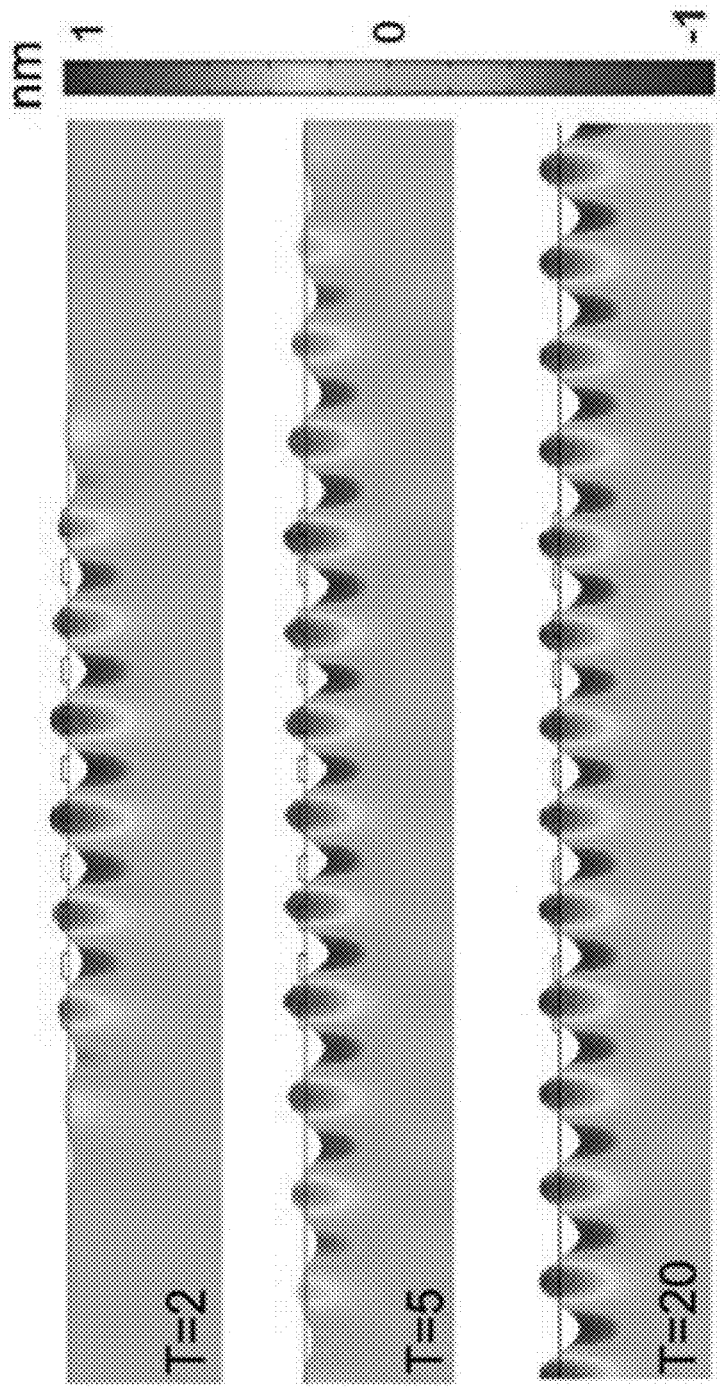
FIG. 5 illustrates a close-up view of the displacement field in the vertical direction over the $LiNbO_3$ domain at T=2, T=5, and T=20 for the first phase configuration.

FIG. 5 illustrates a close-up view of the displacement field in the vertical direction over the LiNbO$_3$ domain at T=2, T=5, and T=20 for the first phase configuration. Deformations are intentionally scaled up for better visualization of the Rayleigh waves. The surface plot in FIG. 5 shows the close-up view of the displacement field solutions over the LiNbO$_3$ domain, at the time periods T=2, T=5, and T=20.

Figure 6:
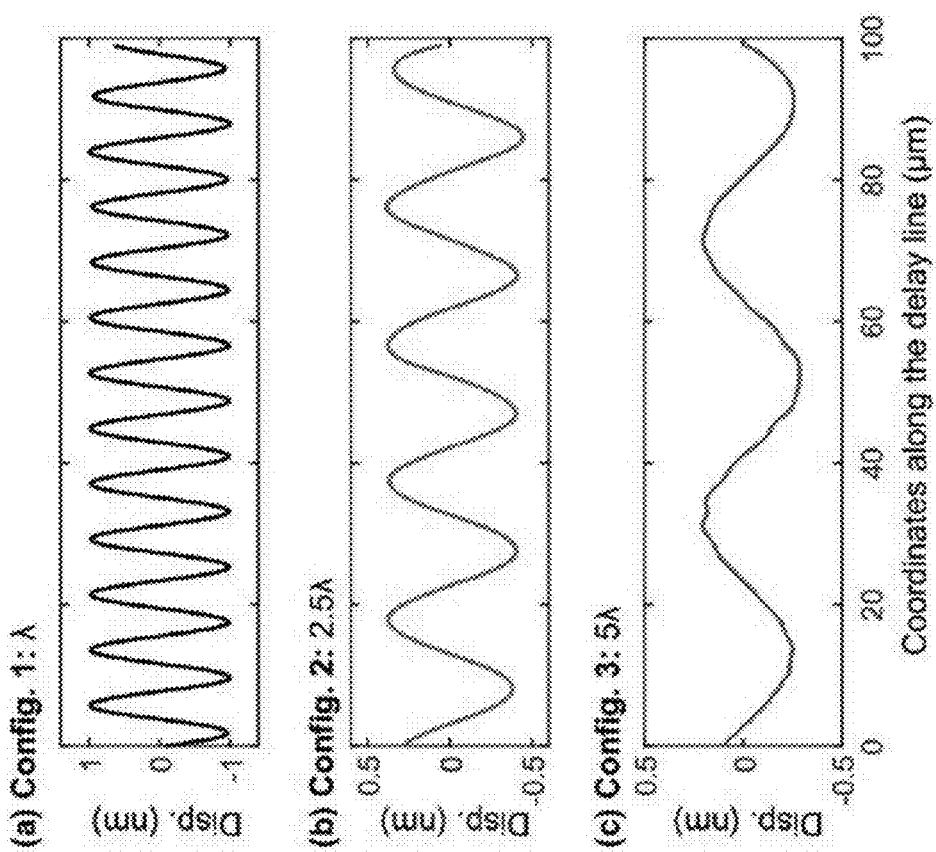
FIG. 6 illustrates displacement profiles of the SAWs along the delay line coordinates for the phase configurations (a) 1, (b) 2, and (c) 3 illustrated in FIG. 4B.

FIG. 6 illustrates displacement profiles of the SAWs along the delay line coordinates for the phase configurations (a) 1, (b) 2, and (c) 3 illustrated in FIG. 4B. The displacement profile along the complete delay line at T=20, is demonstrated in FIG. 6(*a*) and the wavelength may be calculated as 8 μm. On the other hand, for the phase configurations 2 and 3, excitation frequencies are set to f/2.5, and f/5, and correspondingly wavelengths of 20 and 40 μm are illustrated in FIGS. 6(*b*) and (*c*), respectively.

Changing the phase applied to the IDT electrodes 202 may not be used to obtain the absolute surface displacement. The displacement is a function of the RF voltage amplitude as well as the number of IDT electrodes 202 (or the transducer area).

Example Fabrication Process

Figure 7:
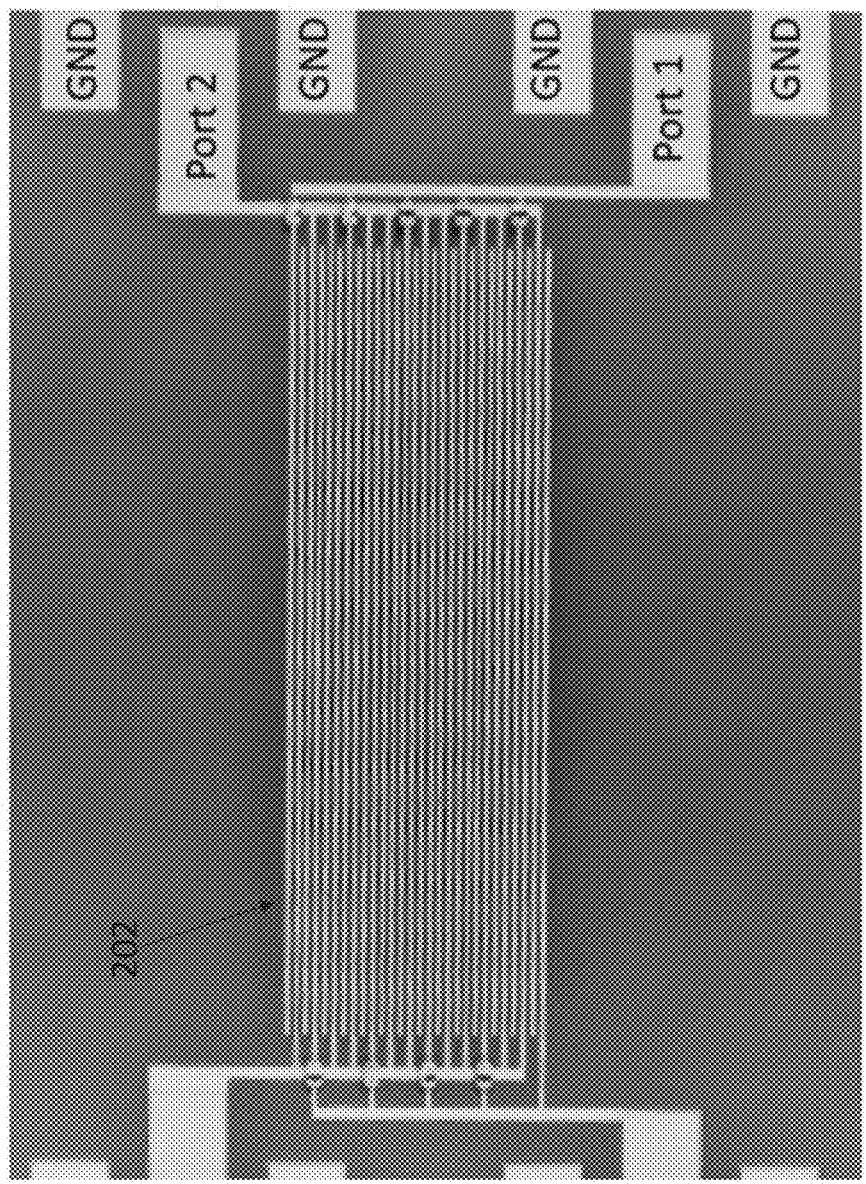
FIG. 7 illustrates an optical image captured at 5× magnification of an example 1 mm long SAW device with three IDT configurations designed for a SAW wavelength of 24 µm.

IDT electrodes 202 may be fabricated on a piezoelectric substrate 208 such as a SAW grade LiNbO$_3$ substrate. In some embodiments, the IDT electrode width 504 was approximately 5.5 μm. FIG. 7 illustrates an optical image captured at 5× magnification of an example 1 mm long SAW device with three IDT configurations designed for a SAW wavelength of 24 μm. The GSG pads, IDT and bridged electrodes are indicated. The electrode layout may be designed for tuning with a phase array, e.g. three different configurations of IDT electrodes 202 were patterned to facilitate independent RF application to each set. The IDT stripe-electrodes 202 may be defined by optical lithography and a lift-off process. Using an electron-beam evaporator, 150-nm-thick Au electrodes with 5-nm-thick Ti as an adhesion layer was deposited on the patterned substrate. The length of the IDT electrodes 202 was approximately 1 mm, and was aligned parallel to a major flat of the piezoelectric substrate 208.

Figure 8:
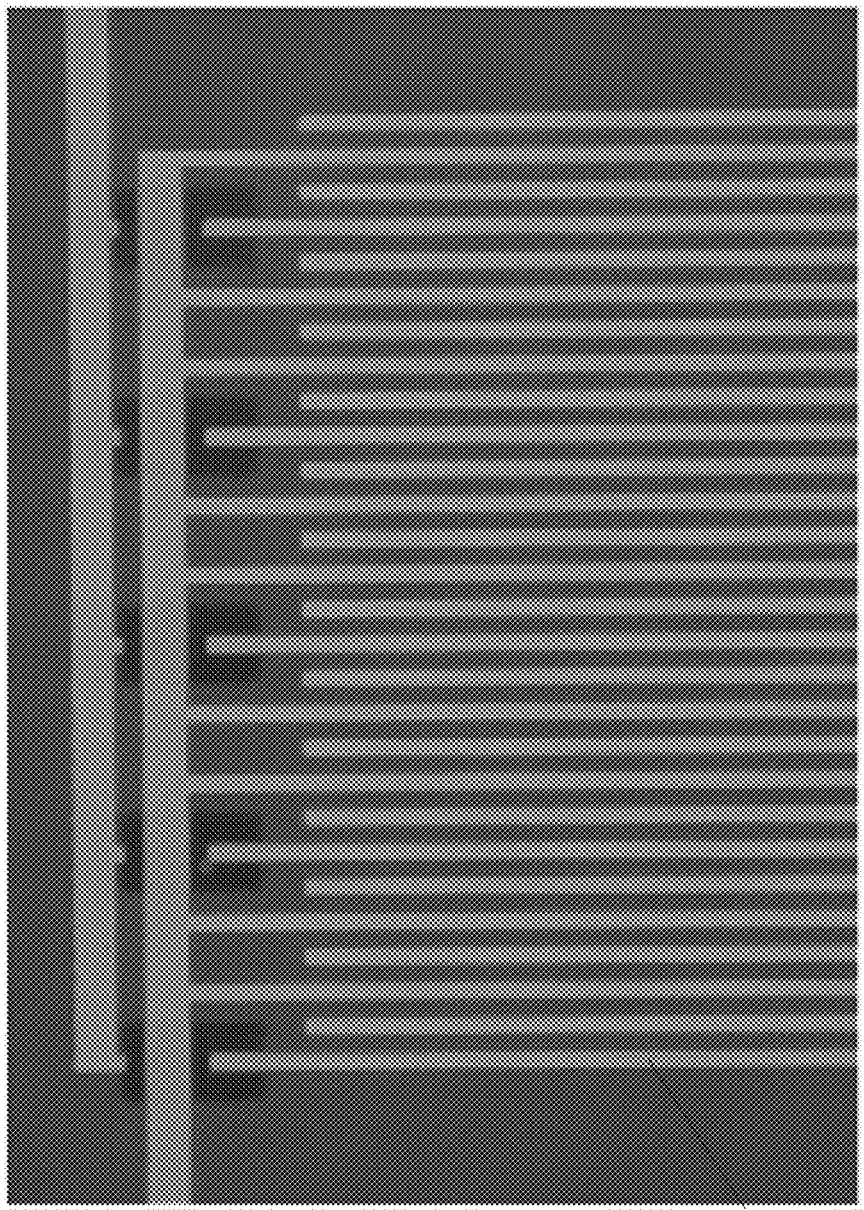
FIG. 8 illustrates an optical image captured at 20× magnification of the bridged electrodes with a silicon dioxide patch for isolation.

FIG. 8 illustrates an optical image captured at 20× magnification of the bridged electrodes with a silicon dioxide patch for isolation. To isolate each of the IDT electrode 202 configurations, every 1st and 7th set of stripes were broken and a 100-nm-thick patch of sputtered silicon dioxide deposited on the stripe gaps. The final example device was completed with an evaporated stripe of approximately 300-nm-thick Au deposited on top of the silicon dioxide patch to bridge the broken electrodes and complete the connection to its corresponding bus line and GSG pads.

It is noteworthy that the thermal and pyroelectric properties of the LiNbO$_3$ substrate may require different fabrication methods, namely etch back processes which may result in ESD damage to the metal. The LiNbO$_3$ substrate may be slowly heated to prevent cracking or shattering; and electron-beam lithography may not be straightforward due to distortions in the electric field during patterning resulting in field stitching errors.

Figure 9:
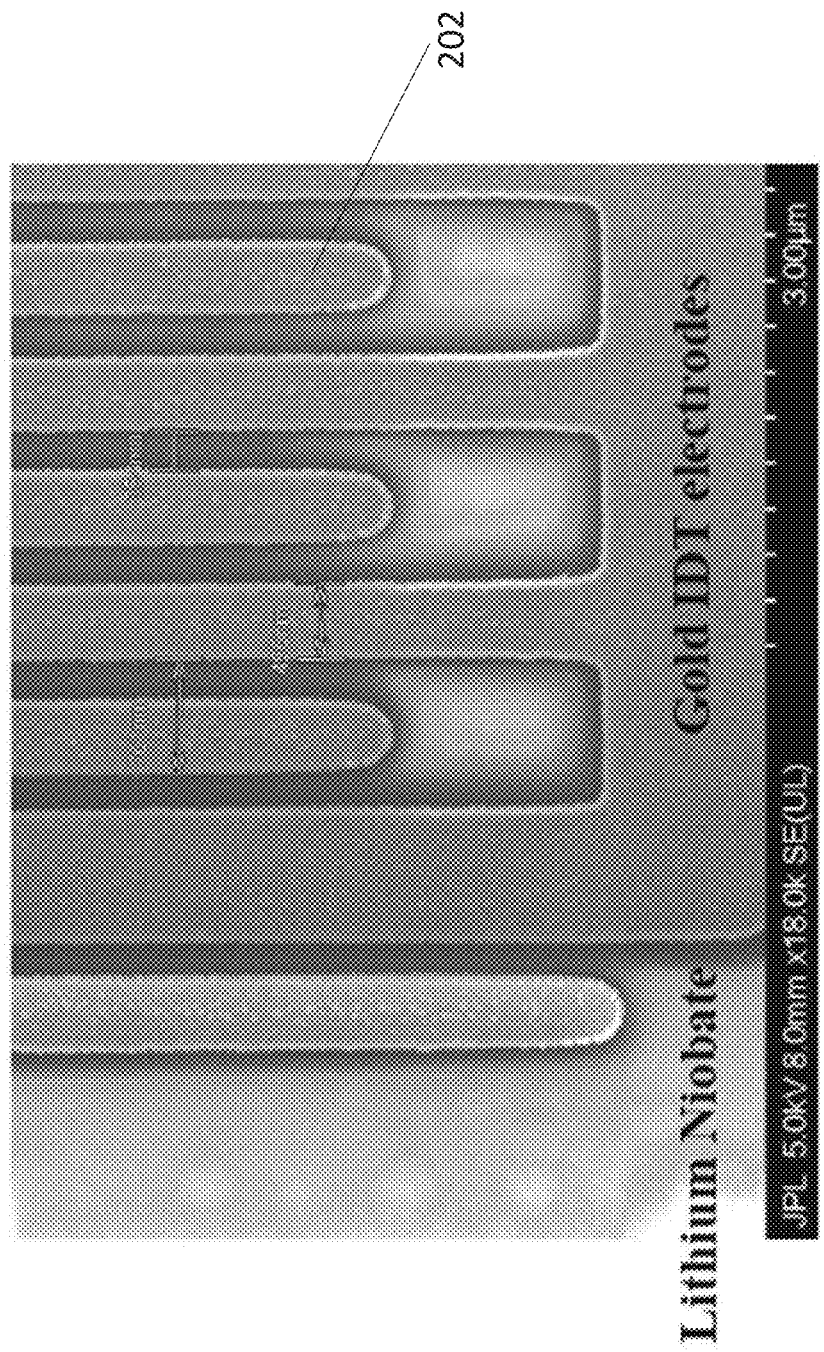
FIG. 9 illustrates a scanning electron micrograph (SEM), captured at 18k× magnification, of IDT electrodes.

FIG. 9 illustrates a scanning electron micrograph (SEM), captured at 18k× magnification, of IDT electrodes. The IDT electrodes were patterned by deep UV lithography and deposited by metal evaporation. The SAW wavelength in this embodiment was approximately 1.5 μm, with an electrode line/space measurement of 496 nm/254 nm and a ratio of 65/35. In some embodiments, electrode linewidths may be narrower than 600 nm.

Example Results

Figure 10:
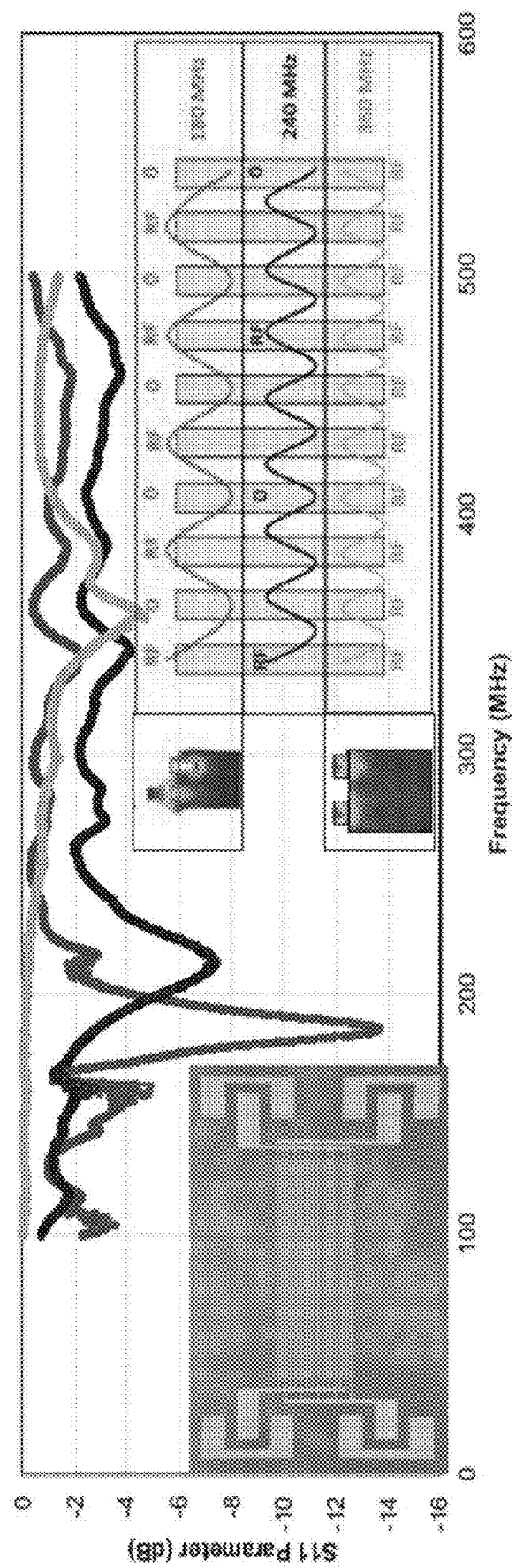
FIG. 10 illustrates example measurement results of a tunable SAW actuator on lithium niobate.

The frequency of the SAW device may be tuned by changing the configuration of the IDT electrodes 202. The IDT electrode width 504 in this example embodiment was 5.5 μm. FIG. 10 illustrates example measurement results of a tunable SAW actuator on lithium niobate. The frequency response was tuned by changing the configuration of IDT electrodes 202 as shown in the inset. A picture of the fabricated tunable SAW device is also shown. The frequency is tuned from 180 MHz to 360 MHz. FIG. 10 shows the frequency response of the device for the three different configurations shown in the inset diagram on the bottom right. In this example, the device was directly connected to the VNA without a phase shifter. When RF voltage (π phase) is applied to all IDT fingers, the dominant mode has a frequency of 360 MHz (e.g. $\lambda_{SAW}$=IDT electrode pitch). When RF voltage is applied to alternate electrodes (e.g. the regular SAW configuration), the frequency may be 180 MHz (e.g. $\lambda_{SAW}$=2×IDT electrode pitch). Finally, when RF is applied to every 8th electrode the frequency may be 240 MHz (e.g. $\lambda_{SAW}$=1.5×IDT electrode pitch). The frequency of the device may be set to the second harmonic if the phase difference between the IDT electrodes 202 is set to zero. This means that a mode with $\lambda_{SAW}$=IDT electrode pitch can be effectively transduced which alleviates the need for narrow IDT finger patterning to address the small optical wavelengths.

Figure 11:
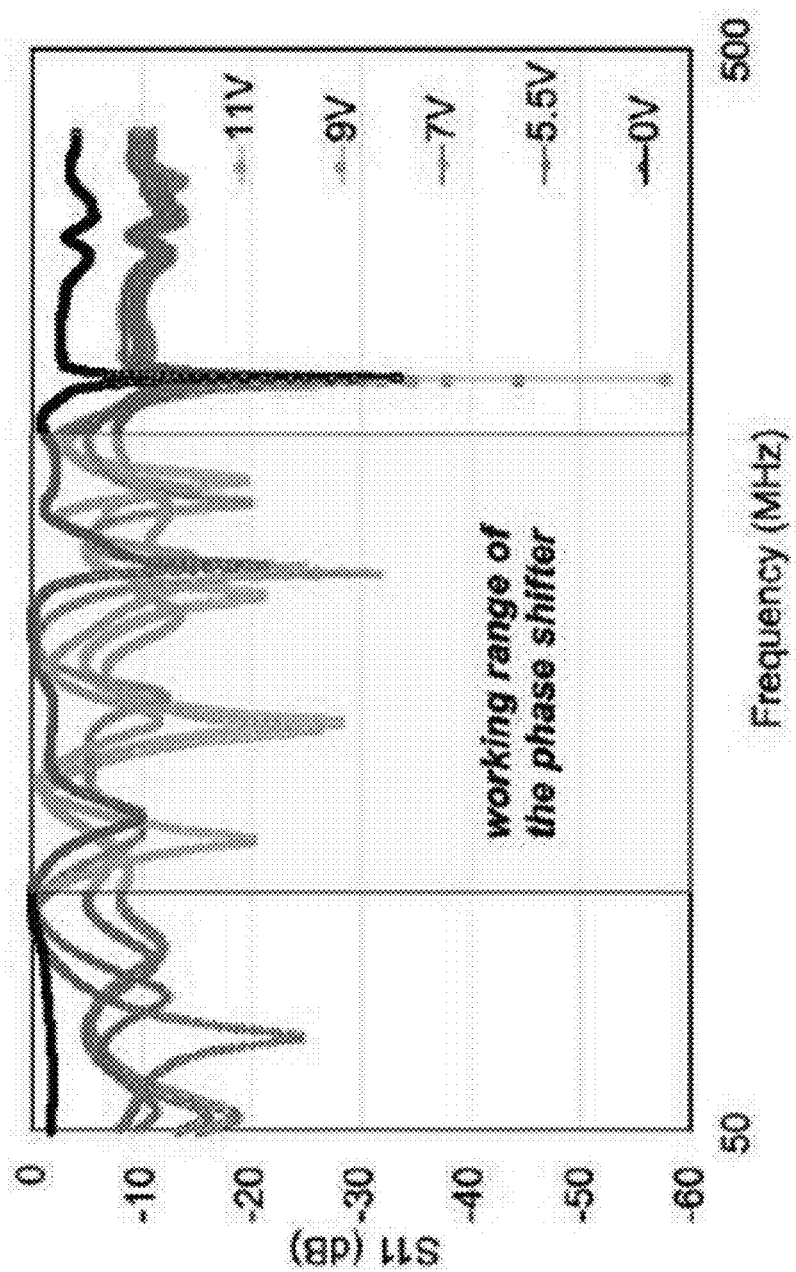
FIG. 11 illustrates the measured scattering parameter at Port 1 ($S_{11}$) of the IDT electrodes illustrated in FIG. 7.

In a different example, Port 1 was connected the VNA and Port 2 was connected to the same port of the VNA through a JSPHS-150+ phase shifter and a power splitter from Mini-Circuits. FIG. 11 illustrates measured $S_{11}$ parameter of the SAW transducer as a function of the applied bias to the phase shifter. FIG. 11 illustrates the measured scattering parameter at Port 1 ($S_{11}$) of the IDT electrodes illustrated in FIG. 8. The working range of the phase shifter is highlighted. Note that the phase shifter had a cut-off frequency of 200 MHz and thus the resonance mode at 240 MHz was not changed with changing the bias applied to the phase shifter (or with the phase of the electrodes).

Figure 12:
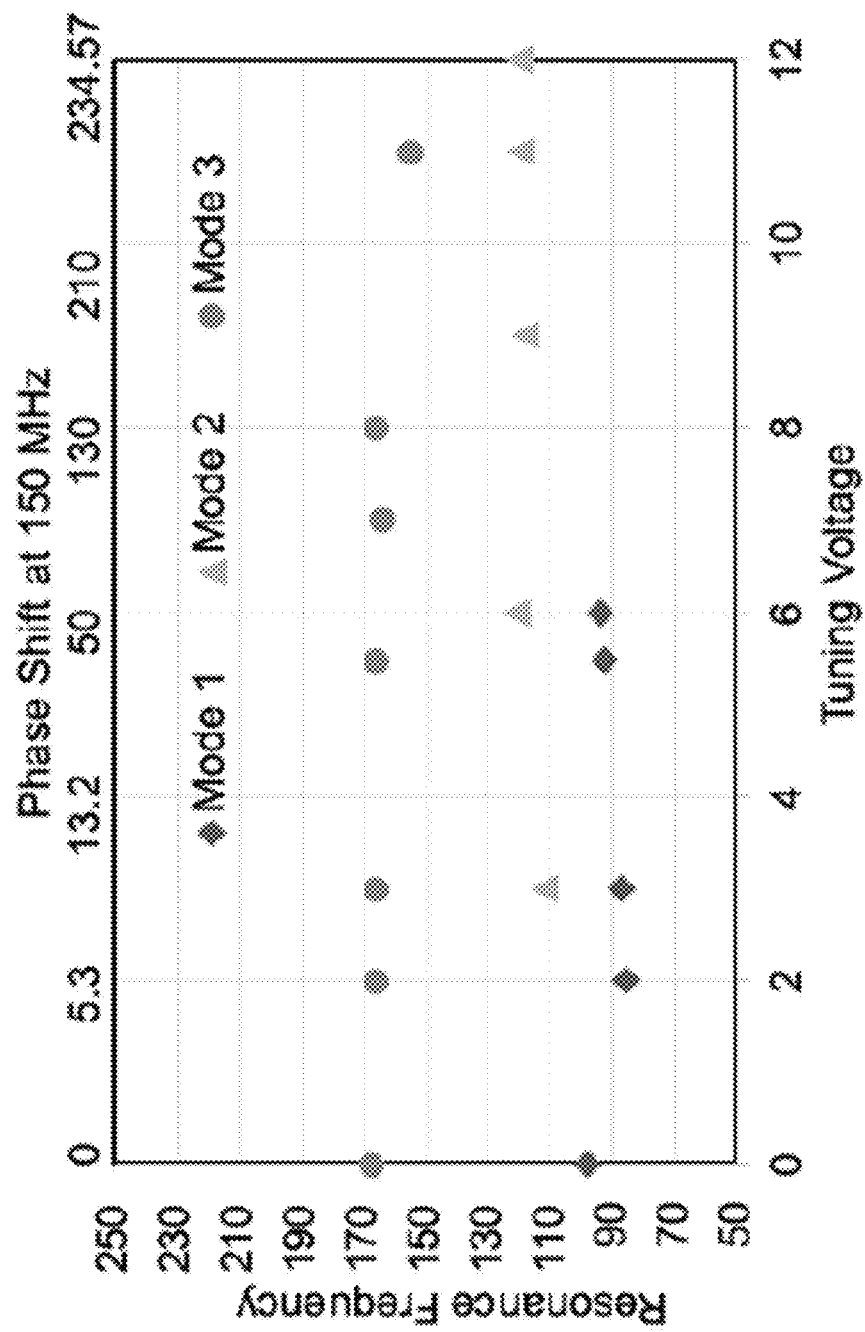
FIG. 12 illustrates measured change in modal frequency (in MHz) with applied bias (V) when Port 2 of the IDT electrodes illustrated in FIG. 7 is connected to the phase shifter.

FIG. 12 illustrates measured change in modal frequency (in MHz) with applied bias (V) when Port 2 of the IDT electrodes illustrated in FIG. 7 is connected to the phase shifter. Note that the phase shift (in degree) at frequencies>200 MHz is negligible, thus 240 MHz mode does not change with bias. FIG. 12 shows the frequency response as a function of voltage/phase shift at 150 MHz. As shown, the example SAW device covers a frequency range of ~86 MHz to 240 MHz (not including the 360 MHz mode shown in FIG. 10). Using this SAW device, the $\lambda_{optical}$ may be from 1.3 μm to 9 μm. The estimated diffraction efficiency, assuming a small surface amplitude, is shown in FIG. 2.

DOCTRINE OF EQUIVALENTS

While the above description contains many specific embodiments of the invention, these should not be construed as limitations on the scope of the invention, but rather as an example of one embodiment thereof. It is therefore to be understood that the present invention may be practiced in ways other than specifically described, without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents. Littrow angle, mechanical baffle and beam dump can be placed to eliminate the spectral overlap.

What is claimed is:

1. A tunable diffraction grating comprising:
    a piezoelectric substrate comprising an interdigital transducer (IDT) region and a delay line region; and
    a plurality of IDT electrodes positioned in the IDT region, wherein the plurality of IDT electrodes are each individually addressable such that the signal applied to each of the plurality of IDT electrodes is phase shifted, and
    wherein the plurality of IDT electrodes provide the phase shifted signal to induce surface acoustic waves in the piezoelectric substrate in a pattern which produces a grating in the delay line region.

2. The tunable diffraction grating of claim 1, wherein the piezoelectric substrate comprises lithium niobate, aluminum nitride, or scandium aluminum nitride.

3. The tunable diffraction grating of claim 1, wherein a pitch of the grating in the delay line region is tunable based on the phase shift to the signal applied to each of the plurality of IDT electrodes.

4. The tunable diffraction grating of claim 1, wherein:
    the plurality of IDT electrodes are configured to provide a phase shift to a first IDT electrode of π and then adding additional phase shift of π/m sequentially to each adjacent electrode until the mth electrode which is applied no phase shift,
    after the mth electrode, the following electrodes add a π/m phase delay sequentially to each adjacent electrode until a phase shift of π,
    m is a positive integer value.

5. The tunable diffraction grating of claim 4, wherein an optimum diffraction efficiency is achieved by changing the phase of the signal applied to each IDT electrode to adjust the SAW wavelength of the grating with respect to the optical wavelength of the inbound light on the grating.

6. The tunable diffraction grating of claim 1, wherein a common alternating RF source is applied to a plurality of phase shifters each applied to one of the plurality of IDT electrodes.

7. The tunable diffraction grating of claim 1, wherein the delay line region is coated with a material to enhance diffraction efficiency of the grating.

8. The tunable diffraction grating of claim 7, wherein the material comprises a polymer.

9. The tunable diffraction grating of claim 8, wherein the polymer comprises PMMA or polyimide.

10. The tunable diffraction grating of claim 7, wherein the material comprises a phase change material.

11. The tunable diffraction grating of claim 10, wherein the phase change material comprises vanadium oxide or germanium telluride.

12. The tunable diffraction grating of claim 7, wherein the phase change material coating is strain patterned by applying the alternating RF signal to the plurality of IDT electrodes.

13. The tunable diffraction grating of claim 1, wherein the phase shifted signal applied to each of the plurality of IDT electrodes is provided by a phased array.

14. The tunable diffraction grating of claim 1, wherein the phase shifted signal utilizes harmonics to induce surface acoustic waves with wavelengths which are smaller than what would be induced without harmonics.

15. A method of operating a tunable diffraction grating comprising:
    providing a piezoelectric substrate including an actuator region and a delay line region; and
    applying a signal to the actuator region such that multiple different regions within the actuator region with different phase shifts are formed,
    wherein the signal with different phase shifts in the actuator region induces a tunable wavelength surface acoustic wave travelling on the delay line region, and
    wherein the delay line region is used as a tunable pitch diffraction grating.

16. The method of claim 15, wherein the signal applied is adjusted to provide a height of the grating.

17. The method of claim 15, wherein the signal applied is an RF voltage.

18. The method of claim 15, wherein applying the signal to the actuator region such that the multiple different regions within the actuator region with different phases are formed comprises applying a signal with a π phase delay to every other region and applying a signal with no phase delay to the rest of the regions, where the wavelength of inbound optical light is modulated by the grating.

19. The method of claim 15, wherein applying the signal to the actuator region such that the multiple different regions within the actuator region with different phases are formed comprises:
    applying a signal with a π phase delay to a first region and then adding π/m sequentially to each adjacent region until the mth region which is applied no phase shift,
    after the mth region, applying a signal adding an π/m phase delay sequentially to each adjacent region until a phase shift of π,
    wherein m is a positive integer value, and
    wherein the wavelength of optical light is modulated by the grating.

20. The method of claim 15, wherein applying a signal to the actuator region such that the multiple different regions within the actuator region with different phase shifts are formed is performed using an alternating RF source and phase shifters.

21. The method of claim 15, wherein the grating in the delay line region is tunable based on the voltages with different phases applied to the multiple different regions.

22. The method of claim 15, wherein the piezoelectric substrate comprises lithium niobate, aluminum nitride, or scandium aluminum nitride.

23. The method of claim 15, wherein the pitch of the grating in the delay line region is tunable based on the signal with the different phase shift applied to each actuator region.

* * * * *